US011886122B2

(12) United States Patent
Seo et al.

(10) Patent No.: US 11,886,122 B2
(45) Date of Patent: Jan. 30, 2024

(54) DEEP ETCHING SUBSTRATES USING A BI-LAYER ETCH MASK

(71) Applicants: FRAUNHOFER USA, INC., Plymouth, MI (US); The Research Foundation for The State University of New York, Buffalo, NY (US)

(72) Inventors: Jung-Hun Seo, Buffalo, NY (US); Yixiong Zheng, Amherst, NY (US); Matthias Muehle, Howell, MI (US)

(73) Assignees: FRAUNHOFER USA, INC., Plymouth, MI (US); THE RESEARCH FOUNDATION FOR THE STATE UNIVERSITY OF NEW YORK, Amherst, NY (US)

( * ) Notice: Subject to any disclaimer, the term of this patent is extended or adjusted under 35 U.S.C. 154(b) by 93 days.

(21) Appl. No.: 17/357,666

(22) Filed: Jun. 24, 2021

(65) Prior Publication Data
US 2022/0413389 A1 Dec. 29, 2022

(51) Int. Cl.
C23C 14/04 (2006.01)
G03F 7/36 (2006.01)
C23C 14/06 (2006.01)
C23C 14/58 (2006.01)

(52) U.S. Cl.
CPC ............. *G03F 7/36* (2013.01); *C23C 14/04* (2013.01); *C23C 14/06* (2013.01); *C23C 14/5873* (2013.01); *B81C 2201/0146* (2013.01)

(58) Field of Classification Search
None
See application file for complete search history.

(56) References Cited

U.S. PATENT DOCUMENTS

| 6,245,596 | B1 | 6/2001 | Kosaki et al. |
| 6,358,427 | B1 | 3/2002 | Smith et al. |
| 8,101,526 | B2 | 1/2012 | Lee et al. |
| 2003/0168730 | A1* | 9/2003 | Davidson ............. H01L 23/473 257/E23.098 |
| 2012/0264237 | A1* | 10/2012 | Shearn ................ B81C 1/00111 257/E21.53 |

(Continued)

FOREIGN PATENT DOCUMENTS

WO WO-97/03846 A1 2/1997

OTHER PUBLICATIONS

AZO Materials, "Chromium (Cr)—Properties, Applications", https://www.azom.com/article.aspx?ArticleID=9081, Dated Jul. 15, 2013, Accessed Nov. 17, 2022 (Year: 2013).*

(Continued)

*Primary Examiner* — Shamim Ahmed
*Assistant Examiner* — Bradford M Gates
(74) *Attorney, Agent, or Firm* — FOLEY & LARDNER LLP

(57) ABSTRACT

A method comprising providing a carbonaceous material, the substrate having a first thermal conductivity. The method further comprises depositing a first masking layer having a second thermal conductivity on at least a portion of the substrate, a ratio of the second thermal conductivity to the first thermal conductivity being less than or equal to 1:30. The method further comprises depositing a second masking layer on the first masking layer to form an etch mask, and etching an exposed portion of the substrate.

20 Claims, 8 Drawing Sheets

(56) References Cited

U.S. PATENT DOCUMENTS

2014/0190824 A1* 7/2014 Credo ................ G01N 27/3277
                                                    204/403.01
2016/0052789 A1  2/2016 Gaathon et al.
2020/0199780 A1  6/2020 Quack et al.
2020/0355857 A1* 11/2020 Quack ................ G02B 27/1073

OTHER PUBLICATIONS

Hicks et al., "Diamond Etching Beyond 10um with Near-Zero Micromasking," Scientific Reports, vol. 9, Oct. 2019, pp. 1-6.
Toros et al., "Precision micro-mechanical components in single crystal diamond by deep reactive ion etching," Microsystems & Nanoengineering, vol. 4, No. 12, Jun. 18, 2018 (8 pages).
Toros et al., "Reactive ion etching of single crystal diamond by inductively coupled plasma: State of the art and catalog of recipes," Diamond & Related Materials, vol. 108, Apr. 1, 2020, pp. 1-17.
Anderson, C. (2008), Thermal Heat Transport Characterization for Macroscale, Microscale, and Nanoscale Heat Conduction. Retrieved from the University of Minnesota Digital Conservancy, https://hdl.handle.net/11299/46904.
Leng et al., Study on Fabrication of the Diamond Film Gear in Micro-system, (2009) IEEE International Conference on Mechatronics and Automation, pp. 1656-1660, doi: 10.1109/ICMA.2009.5246309.
PCT International Search Report and Written Opinion dated Oct. 12, 2022 in International Application No. PCT/US2022/033652.
Seung-Woo Jeon et al., (2020), Diamond photonic crystal mirror with a partial bandgap by two 2D photonic crystal layers, in: Optics Express 2020, vol. 28, Issue 26, pp. 39048-39057.

* cited by examiner

DEEP ETCHING SUBSTRATES USING A BI-LAYER ETCH MASK

GOVERNMENT LICENSE RIGHTS

This invention was made with government support under Grant No. 1809077 awarded by the National Science Foundation. The government has certain rights in the invention.

TECHNICAL FIELD

The present invention relates generally to methods for etching carbonaceous materials using a hard etch mask.

BACKGROUND

Due to its unique combination of outstanding physical and chemical properties, such as wide band-gap, chemical inertness, the highest hardness and thermal conductivity, negative electron affinity, and biocompatibility, carbonaceous materials such as diamond are considered to be promising materials for application in electronic and micro-electromechanical devices, biomedical sensors, electrochemical electrodes, and field electron emission (FEE) devices. However, for diamond to be reliably used in applications, a precise etching process is needed. This is particularly true for electronic applications that require etching at the micro- or nano-scale.

SUMMARY

Embodiments described herein relate generally to hard masks for etching carbonaceous materials, and in particular, to bi-layer etch masks, and methods of etching carbonaceous materials using such etch masks.

In some embodiments, a method comprises providing a substrate including a carbonaceous material, the substrate having a first thermal conductivity. The method further comprises depositing a first masking layer having a second thermal conductivity on at least a portion of the substrate, a ratio of the second thermal conductivity to the first thermal conductivity being less than or equal to 1:30. The method further comprises depositing a second masking layer on the first masking layer to form an etch mask. The method further comprises etching an exposed portion of the substrate.

In some embodiments, an etched substrate is formed by a process comprising the steps of providing a substrate including a carbonaceous material, the substrate having a first thermal conductivity. The process further comprises depositing a first masking layer having a second thermal conductivity on at least a portion of the substrate, a ratio of the second thermal conductivity to the first thermal conductivity being less than or equal to 1:30. The process further comprises depositing a second masking layer on the first masking layer to form an etch mask. The process further comprises etching an exposed portion of the substrate.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are not, therefore, to be considered limiting of its scope, the disclosure will be described with additional specificity and detail through use of the accompanying drawings.

FIG. 3 shows panel D, which is a SEM image of a diamond substrate with a chromium/nickel bi-layer etch mask.

FIG. 3 shows panels E and F, which are EDX spectra of the diamond substrate with the chromium/nickel bi-layer etch mask.

FIG. 4 shows panels B and C, which are microscopic images of the bi-layer etch mask after 70 minutes and 160 minutes of etching, respectively.

FIG. 4 shows panels D and E, which are SEM images of the bi-layer etch mask after 160 minutes of etching.

FIG. 5 shows panels B and C, which are microscopic images of the bi-layer etch mask after 70 minutes and 160 minutes of etching, respectively.

FIG. 5 shows panels D and E, which are SEM images of the bi-layer etch mask after 160 minutes of etching.

Figure 1:
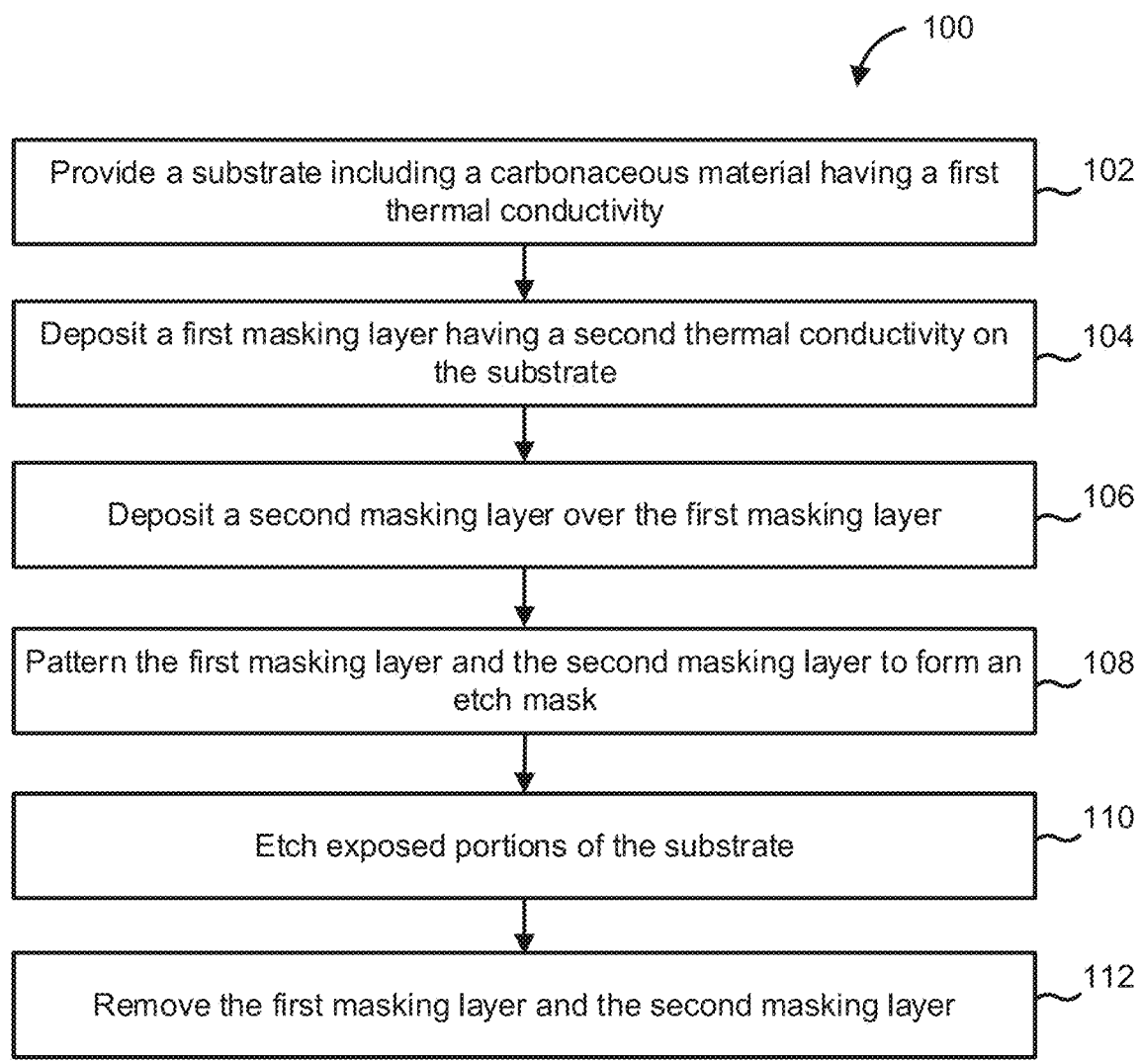
FIG. 1 is a schematic flow diagram of a method for etching a substrate that includes a carbonaceous material using a bi-layer etch mask, according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Embodiments described herein relate generally to hard masks for etching carbonaceous materials, and in particular, to bi-layer etch masks, and methods of etching carbonaceous materials using such etch masks.

Conventional methods have difficulty etching diamond because carbonaceous materials, such as diamond, are chemically inert, which makes it difficult to chemically etch such materials. Mechanical grinding is one conventional method for patterning such materials, but is not applicable for forming micro- or nano-scales patterns. Conventional etch masks for carbonaceous materials (e.g., diamond) require substantial physical thickness due to poor etch selectivity ratio between the carbonaceous substrate and the etch masks, generally less than 1:20. Therefore, the thickness of an etch mask needs to be substantially thicker when deep etching of the carbonaceous material is required. A highly tolerable and durable metal etch mask that has a very high etching selectivity ratio of greater than 1:100 is desired in order to achieve a stable deep diamond etching more than several tens of micrometers.

Moreover, carbonaceous materials, such as diamond, have a high thermal conductivity. Conventional etch masks generally have a thermal conductivity that is substantially lower than diamond. Deep etching of such carbonaceous materials is generally performed using a dry etching process, for example, plasma etching process. The substrate is generally heated to a high temperature during the plasma etching process. The high thermal conductivity of the carbonaceous substrates relative to conventional etch mask causes unequal thermal expansion of the substrate relative to the etch mask. In such instances, the etch mask may crack and fail.

In contrast, embodiments described herein relate to a bi-layer etch mask for deep etching carbonaceous substrates, for example, diamond substrates. In some embodiments, the bi-layer etch mask comprises a first masking layer with a thermal conductivity with a ratio to the thermal conductivity of the carbonaceous substrate being less than or equal to 1:30. The bi-layer mask may further comprise a second masking layer that is an etch-resistant layer having a high etch selectivity ratio to the carbonaceous substrate.

Embodiments of the bi-layer etch masks described herein may provide several benefits including, for example: (1) achieving a stable deep diamond etching of more than several hundreds of micrometers; (2) having an etch selectivity ratio of greater than 1:100 relative to the carbonaceous material; (3) allowing etching of high aspect ratio micro and nano-scale patterns on carbonaceous substrate; and (4) having high thermal conductivity, thereby allowing the etch mask to dissipate heat to the substrate without experiencing mechanical failure due to thermal mismatch during the etching process.

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

FIG. 1 is a schematic flow diagram of an example method 100 for etching a carbonaceous substrate using a bi-layer etch mask, according to some embodiments. The method 100 includes providing a substrate, at 102. The substrate includes a carbonaceous material having a first thermal conductivity, at 102. In some embodiments, the first thermal conductivity is in between about 1800 and about 2300 Watts/(meters Kelvin), inclusive (e.g., 1800, 1900, 2000, 2100, 2200, and 2300 Watts/(meters Kelvin)). In some embodiments, the carbonaceous material may include a sp-3 containing carbonaceous material such as, for example, monocrystalline diamond, randomly oriented diamond (such as, but not limited to, polycrystalline diamond, microcrystalline diamond, nanocrystalline diamond, and ultrananocrystalline diamond), diamond epilayer/film on a heteroepitaxial substrate, or a sp-2 containing carbonaceous material, for example, graphene or graphite, any other suitable substrate, or a combination thereof. The substrate can be in the form of wafers, for example, having a diameter of 3 inches, 4 inches, 6 inches, 8 inches, or 12 inches, inclusive, or have any other shape or size.

A first masking layer is deposited on at least a portion of the substrate, at 104. The first masking layer has a second thermal conductivity with a ratio of the second thermal conductivity to the first thermal conductivity less than or equal to about 1:30 (e.g., 1:0.01, 1:1, 1:10, 1:20, 1:25, or 1:30, inclusive). In some embodiments, the first masking layer has a thermal expansion coefficient below about 10 micrometers/(meters Kelvin) at 25 degrees Celsius. In some embodiments, the first material has a thermal conductivity in a range of about 90 W/(meters Kelvin) to about 110 W/(meters Kelvin). A low thermal expansion coefficient and a high thermal conductivity of the first masking layer allows heat to dissipate to the substrate without any mechanical failure due to a thermal mismatch during the etching process. In some embodiments, the first masking layer comprises chromium. In some embodiments, the first masking layer comprises aluminum, silicon oxide, $Al_2O_3$, Si, SiN, Au, Ti, $Si_3N_4$, Ni, a Ni—Ti alloy, W, Ag, Cu, Fe, Cr, Co, Ga, Ge, In, Mo, NiFe, NiCr, Nb, Pd, Pt, Si, Sn, Ta, Y, MgO, ITO (Indium Tin Oxide, $In_2O_3$—$SnO_2$), titanium oxides ($TiOS_2$, $Ti_2O_3$, $Ti_3O_4$), $ZrO_2$, $HfO_2$, $La_2O_3$, $Y_2O_3$, SiC, or any other suitable material. In particular embodiments, the first masking layer includes Cr.

The first masking layer can be deposited on the substrate using any suitable method such as atomic layer deposition (ALD), sputtering methods, evaporation methods (e.g., thermal evaporation or e-beam evaporation), chemical vapor deposition (CVD), physical vapor deposition (PVD) method, or any other suitable method. In some embodiments, the first masking layer has a first thickness of less than 20 nanometers. In some embodiments, the first masking layer with the first thickness of less than 20 nanometers helps to minimize the strain change during the etching process. In some embodiments, the first masking layer has a first thickness of less than about 10 nanometers. In some embodiments, the first masking layer with a first thickness greater than about 20 nanometers results in mechanical failure during the etching process. In some embodiments, the first masking layer has a thickness in a range of 1 nm to 10 nm (e.g., 1, 2, 3, 4, 5, 6, 7, 8, 9, or 10 nanometers, inclusive).

A second masking layer is deposited on the first masking layer, at 106. In some embodiments, the second masking layer has an etch selectivity ratio of the substrate to the second masking layer of greater than about 1:100. In some embodiments, the second masking layer comprises a material with a density equal to or higher than about 8.0 grams/cubic centimeters, and a third thermal conductivity in a range of about 90 W/(meter Kelvin) to about 110 W/(meter Kelvin). In some embodiments, a ratio of the third thermal conductivity to the first thermal conductivity of the substrate may be less than or equal to 1:30 (e.g., 1:0.01, 1:1, 1:10, 1:20, 1:25, or 1:30, inclusive). In some embodiments, the second masking layer includes aluminum, silicon oxide, $Al_2O_3$, Si, SiN, Au, Ti, $Si_3N_4$, Ni, a Ni—Ti alloy, W, Ag, Cu, Fe, Cr, Co, Ga, Ge, In, Mo, NiFe, NiCr, Nb, Pd, Pt, Si, Sn, Ta, Y, MgO, ITO (Indium Tin Oxide, $In_2O_3$—$SnO_2$), titanium oxides ($TiOS_2$, $Ti_2O_3$, $Ti_3O_4$), $ZrO_2$, $HfO_2$, $La_2O_3$, $Y_2O_3$, SiC, or any other suitable material. In particular embodiments, the second masking layer includes Ni.

The second masking layer can be deposited on the substrate using any suitable method such as atomic layer deposition (ALD), sputtering methods, evaporation methods (e.g., thermal evaporation or e-beam evaporation), or chemical vapor deposition (CVD), physical vapor deposition (PVD) method, or any other suitable method. In some embodiments, the second masking layer has a second thickness greater than the first thickness of the first masking layer. In some embodiments, the second thickness is less than or equal to 5 micrometers (e.g., 1 nanometer, 10 nanometers, 50 nanometers, 100 nanometers, 250 nanometers, 500 nanometers, 750 nanometers, 1 micrometer, 3 micrometers, 4 micrometers, and 5 micrometers, inclusive). In some embodiments, the second thickness is directly proportional to a desired target etching depth. For example, the second thickness increases with an increased desired target etching depth of the carbonaceous substrate. In some embodiments, the ratio of the thickness of the first masking layer to the second masking layer may be in a range of 1:10 to 1:30.

The first masking layer and the second masking layer are patterned to define an etch mask, at 108. The first masking layer and the second masking layer can be patterned using standard lithography techniques, for example, photolithography, chemical etching, etc. In some embodiments, the first masking layer and the second masking layer can be patterned using e-beam lithography (EBL) and then developed in an appropriate developer, for example, a tetramethylammonium hydroxide based developer (e.g., MF® CD-26). In some embodiments, the first masking layer and the second masking layer can be patterned using laser etching or laser lithography. The patterning of the first masking layer and the second masking layer defines a pattern or template for etching the substrate. In other embodiments, a photoresist (e.g., a positive or negative photoresist) may first be deposited on the substrate, and patterned using lithography (e.g., photolithography, e-beam lithography, etc), nanoimprint lithography, or any other suitable technique. The first and second mask layers may then be deposited on the photoresist material and exposed portions of the substrate. The photoresist material is then removed to form the etch mask on the substrate via photoresist liftoff.

Exposed portions of the substrate are etched with the first masking layer and the second masking layer serving together as an etch mask, at 110. The substrate can be etched using any suitable process such as, for example, oxygen plasma etching, reactive ion etching (ME) process, deep reactive ion etching (DRIE), inductively coupled plasma reactive ion etching (ICP-RIE), fluoride gas etching, any plasma based etching method, or any other suitable etching process. In some embodiments, the plasma etch can comprise solely of oxygen or can comprise mixed gases such as $O_2$ and Ar and $SF_6$; $O_2$ and $SF_6$; $O_2$ and $CHF_3$; $O_2$ and $H_2$; or Ar and $Cl_2$. In some embodiments, the substrate is etched using RIE or DRIE in between about 1 and about 300 minutes, inclusive (e.g., 1, 10, 50, 100, 150, 200, 250, and 300 minutes). In some embodiments, the plasma etching process may use gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to etch the substrate. As a non-limiting example, a source power of 1 Watt to 3,000 Watts, a bias power of 1 Volt to 1,500 Volts, a pressure of 0.1 millitorr to 200 torr, and an etch gas flow of 1 sccm to 300 sccm may be used in the etching process. However, it is noted that source powers, bias powers, pressures, and flow rates outside of these ranges are also contemplated.

Thus, method 100 may provide a bi-layer etch mask having the bottom first masking layer that has a low thermal expansion and high thermal conductivity and the top second masking layer that has a high etching resistance which minimizes the thermal and/or plasma damage to the bi-layer etch mask, and while the first masking layer provides efficient heat dissipation during the etching process. In some embodiments, the etch mask may be left disposed on the substrate after etching the substrate. In other embodiments, the first masking layer and the second masking layer are removed, at 112. In some embodiments, the first masking layer and the second masking layer can be removed from over the substrate, for example, using etchants (e.g., perchloric acid, ceric acid, hydrochloric acid, etc.), or any other chemical removers. In some embodiments, the diamond substrate may then be cleaned by any standard cleaning method such as using methanol cleaning, acetone cleaning, ethanol cleaning, ultrasonic cleaning, polishing, the like, or any combination thereof.

Figure 2:
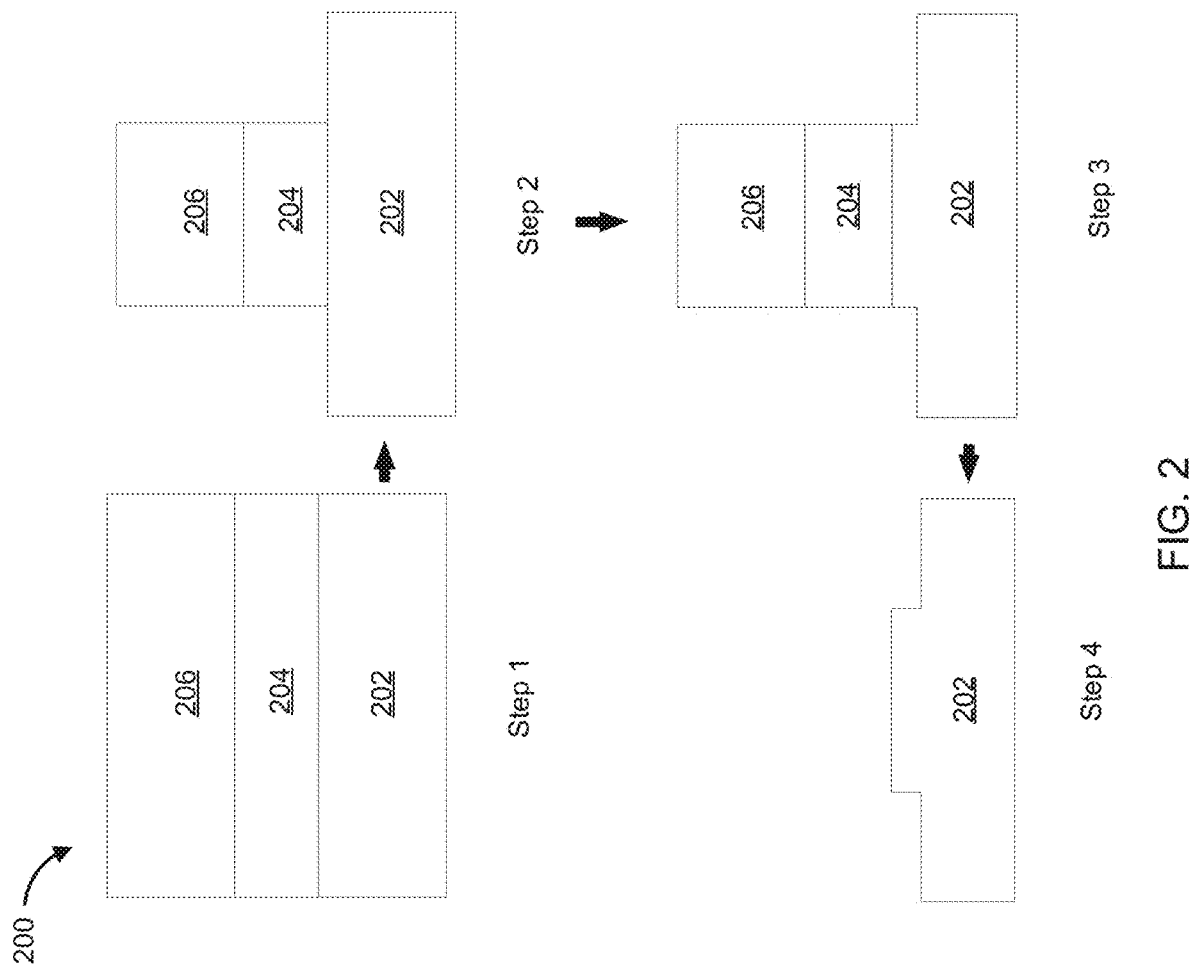
FIG. 2 is a schematic illustration of a various steps in a process for etching a substrate that includes a carbonaceous material using a bi-layer etch mask, according to an embodiment.

FIG. 2 shows schematic illustrations of various steps of a method 200 of etching a carbonaceous substrate using a bi-layer etch mask, according to an embodiment. The method 200 includes providing a substrate 202 that includes a carbonaceous material, at step 1. Moreover, at step 1, the first masking layer 204 is deposited on the substrate, and the second masking layer 206 is deposited on the first masking layer 204. The carbonaceous substrate 202 may include an sp-3 containing carbonaceous material, for example, monocrystalline diamond, randomly oriented diamond (such as, but not limited to, polycrystalline diamond, microcrystalline diamond, nanocrystalline diamond, and ultrananocrystalline diamond), diamond epilayer/film on a heteroepitaxial substrate, or a sp-2 containing carbonaceous material, for example, graphene or graphite, any other suitable substrate, or a combination thereof.

The first masking layer 204 and the second masking layer 206 are patterned to form a bi-layer etch mask, at Step 2. The first masking layer 204 and the second masking layer 206 may include any suitable material and may be deposited via any suitable methods as described with respect to the method 100. At Step 3, using the bi-layer etch mask, the exposed portions of the substrate 206 that are not covered by the etch mask are etched, for example, using dry etching (e.g., a plasma etching) process as described with respect to method 100. In some embodiments, the first masking layer 204 and the second masking layer 206 are then removed, for example, using an appropriate wet etchant, at Step 4.

The following section describes examples of etching a carbonaceous substrate using a bi-layer etch mask. These examples are only for illustrative purposes and are not meant to limit the scope of the concepts described herein.

EXPERIMENTAL EXAMPLES

Figure 3:
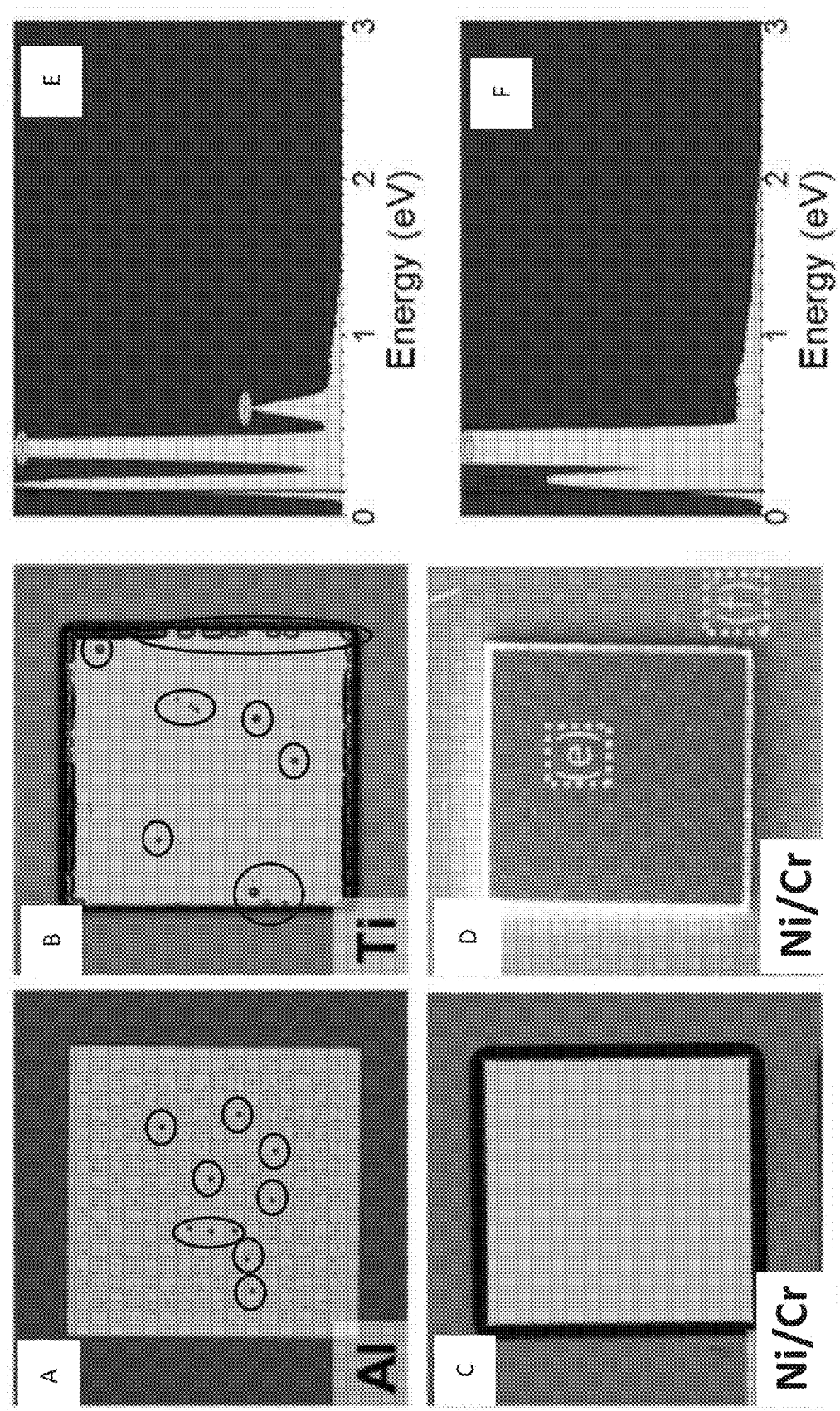
FIG. 3 shows panels A-C, which are microscopic images of an aluminum etch mask, a titanium etch mask, and a nickel etch mask, respectively.

As shown in FIG. 3, panels A-C are microscopic images of a 1 micrometer thick aluminum etch mask, a 300 nanometer thick titanium etch mask, and a bi-layer etch mask that includes a 5 nm thick Cr bottom masking layer and a 150 nm thick Ni top masking layer, respectively, after 70 minutes of deep RIE etching. While surface damage can be observed in the aluminum and titanium mask, no visible damage to the much thinner bi-layer Cr/Ni mask is observed as observable in panel C. Panel D is a scanning electron microscopy (SEM) image of a diamond substrate after being selectively etched via DRIE using the bi-layer mask of panel C. Panels E and F are energy-dispersive x-ray spectroscopy (EDX) spectra of the diamond substrate with the Cr/Ni bi-layer etch mask and without the etch mask, respectively. Panels E and F illustrate that no noticeable difference in composition is observed between the two samples except for the presence of a weak oxygen peak from the masked region that is a sign of the original oxygen terminated diamond surface due to a cleaning process.

Figure 4:
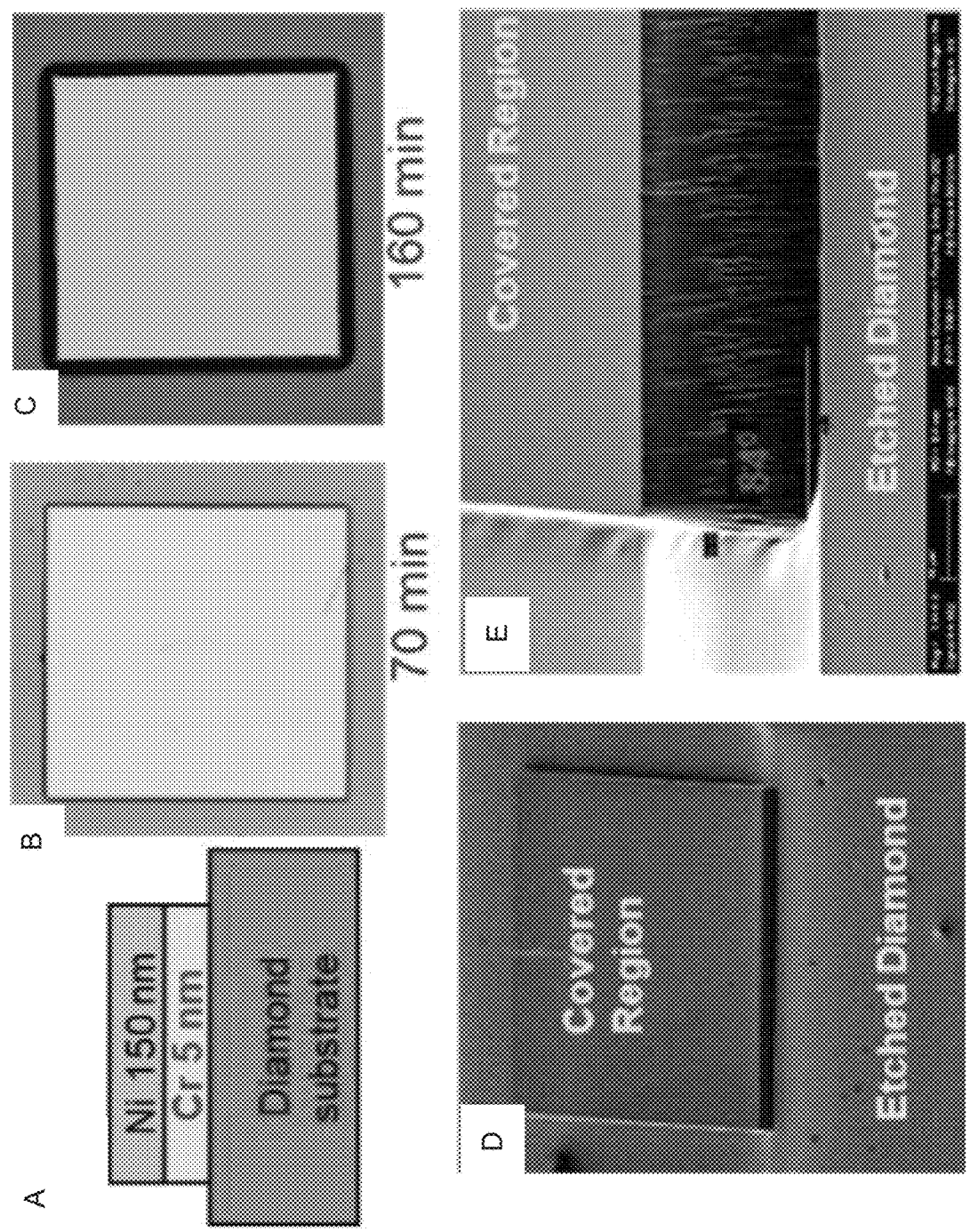
FIG. 4 shows panel A, which is a schematic diagram of a bi-layer etch mask comprising chromium and nickel on a diamond substrate with the chromium layer having a thickness of 5 nm.

As shown in FIG. 4, panel A is a schematic diagram of a Cr/Ni bi-layer etch mask disposed on a diamond substrate with a chromium layer thickness of 5 nm and a nickel layer thickness of 150 nm. Panels B and C are microscopic images of the bi-layer etch mask after 70 minutes and 160 minutes of etching, respectively. Panels D and E are SEM images of the bi-layer etch mask after 160 minutes of etching. Panels B, C, D, and E illustrate that the etch mask protects the diamond surface without experience any noticeable damage indicating the efficacy of the bi-layer etch as for high aspect ratio etching of carbonaceous substrates, particularly diamond.

Figure 5:
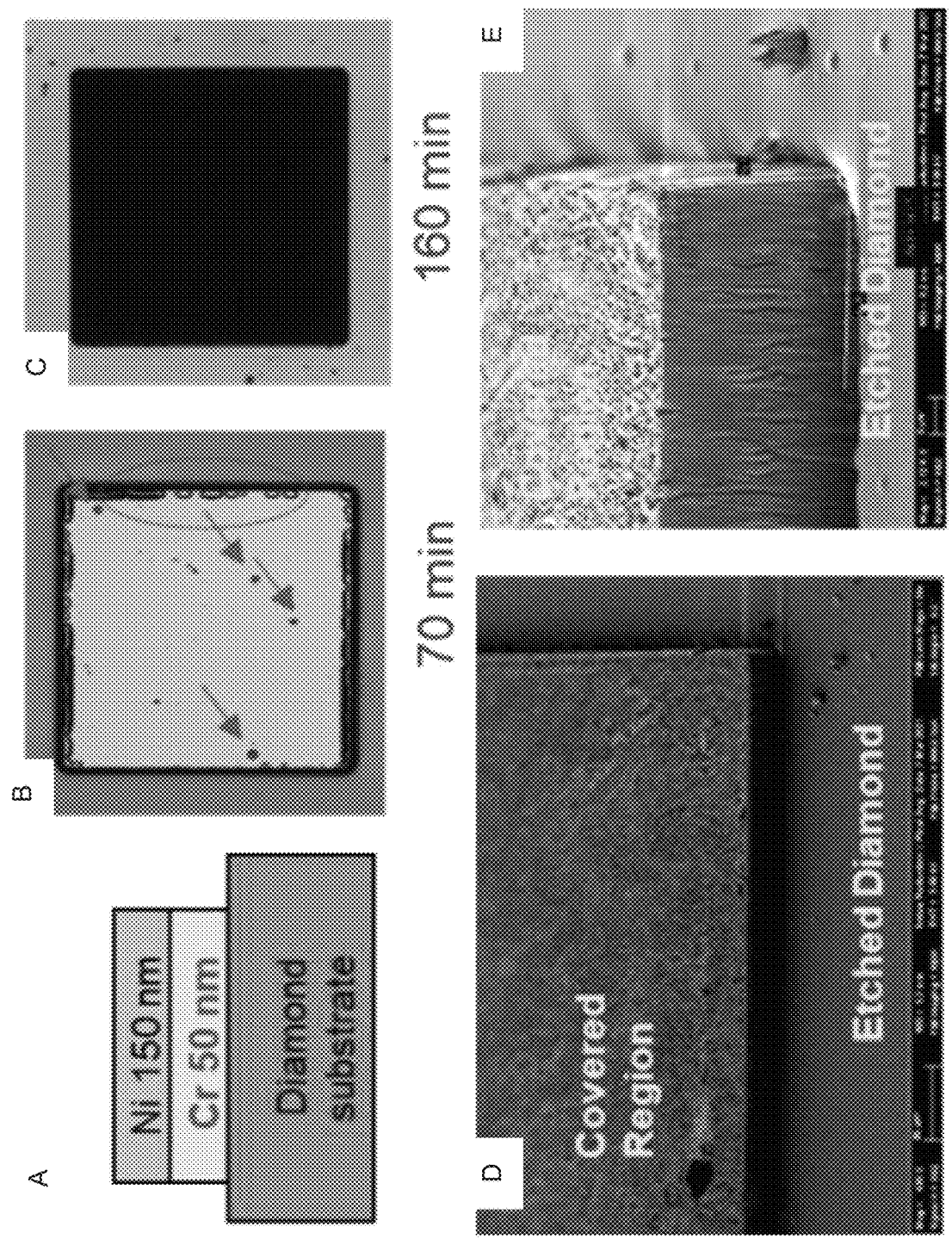
FIG. 5 shows panel A, which is a schematic diagram of a bi-layer etch mask comprising chromium and nickel on a diamond substrate with the chromium layer having thickness of 50 nm.

As shown in FIG. 5, panel A is a schematic diagram of a bi-layer etch mask comprising of chromium and nickel on a diamond substrate with a chromium layer thickness of 50 nm and a nickel layer thickness of 150 nm. Panels B and C are microscopic images of the bi-layer etch mask after 70 minutes and 160 minutes of etching, respectively. Panels D and E are SEM images of the bi-layer etch mask after 160 minutes of etching. Panels B, C, D and E illustrate that the etch mask fails to protects the diamond surface. Therefore, controlling the thickness of the chromium bottom masking layer is desirable as too thick a bottom masking layer may actually result in lower reliability bi-layer etch mask that is more susceptible to damage. In some embodiments, the bottom masking layer (e.g., the chromium masking layer) as a thickness of less than 20 nm. In some embodiments, the bottom masking layer has a thickness in a range of 1 nm to 10 nm (e.g., 1, 2, 3, 4, 5, 6, 7, 8, 9, or 10 nanometers, inclusive).

Figure 6:
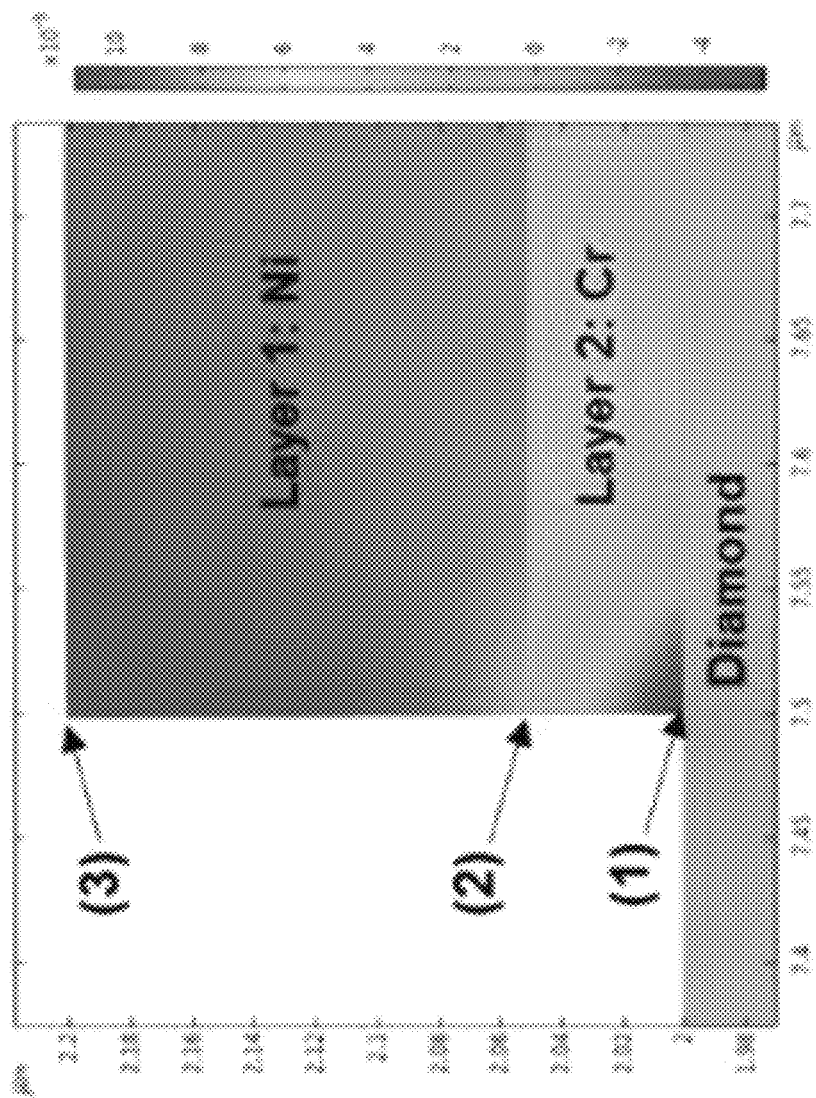
FIG. 6 is a finite element simulation of an example strain distribution of a chromium/nickel bi-layer etch mask on diamond under different thermally induced strain conditions.

FIG. 6 is an output from a finite element simulation software of an example strain distribution of a chromium/nickel bi-layer etch mask on a diamond substrate under different thermally induced strain conditions during a plasma etching process. Point 1 is defined as at the top of the diamond substrate underneath the chromium layer. Point 2 is defined as the top of the chromium layer underneath the nickel layer. Point 3 is defined as the top of the nickel layer.

Figure 7:
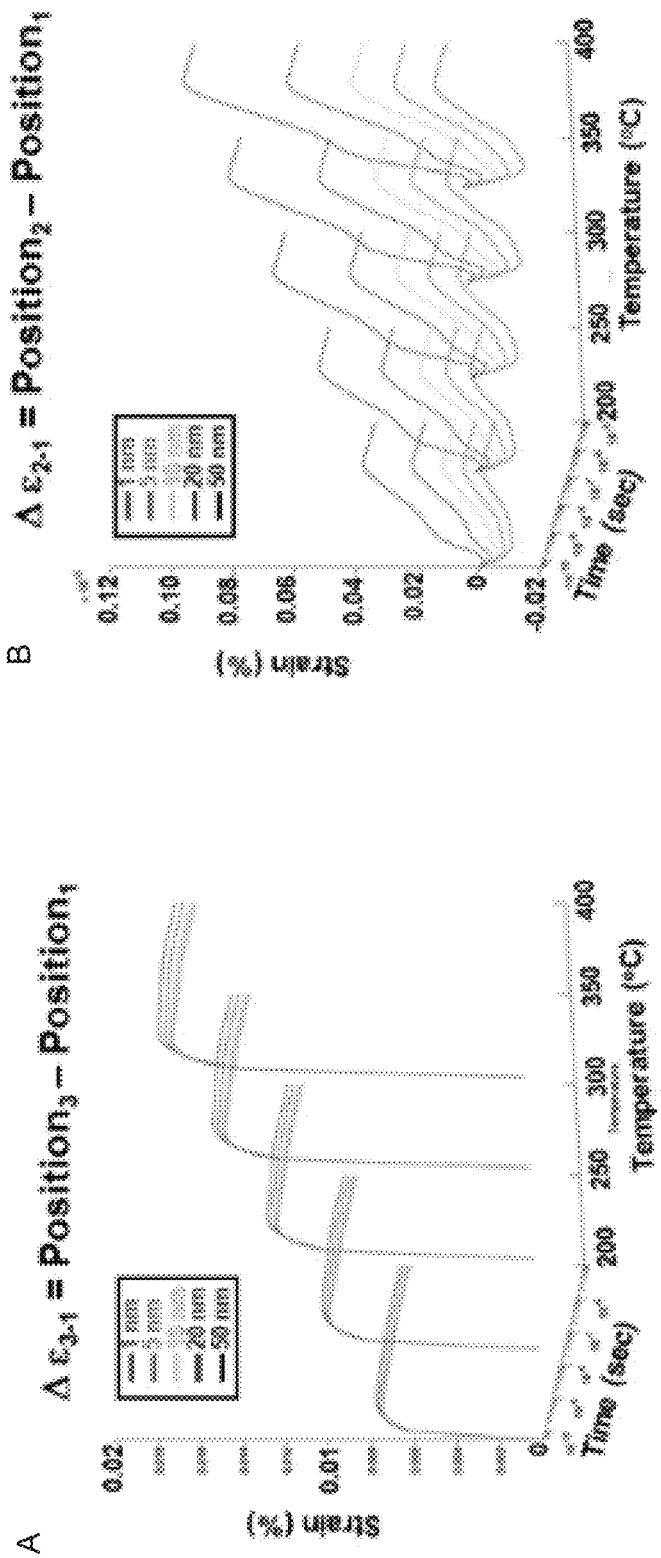
FIG. 7 shows panels A and B, which are finite element simulations of the example strain distribution from FIG. 6 between the point 1 and 3 and between the point 2 and 3, respectively, as a function of time and temperature.

As shown in FIG. 7, panels A and B are finite element simulations of the example strain distribution from FIG. 6 between point 1 and 3 and between point 2 and 3, respectively, as a function of time and temperature. Panel A illustrates that strain only changes under different temperatures regardless of the thickness of the chromium layer. Panel B illustrates that a much higher degree of strain change occurs between the points 1 and 2 dependent on the chromium layer thickness, which can cause delamination of the etch mask due to a thermally induced strain.

Figure 8:
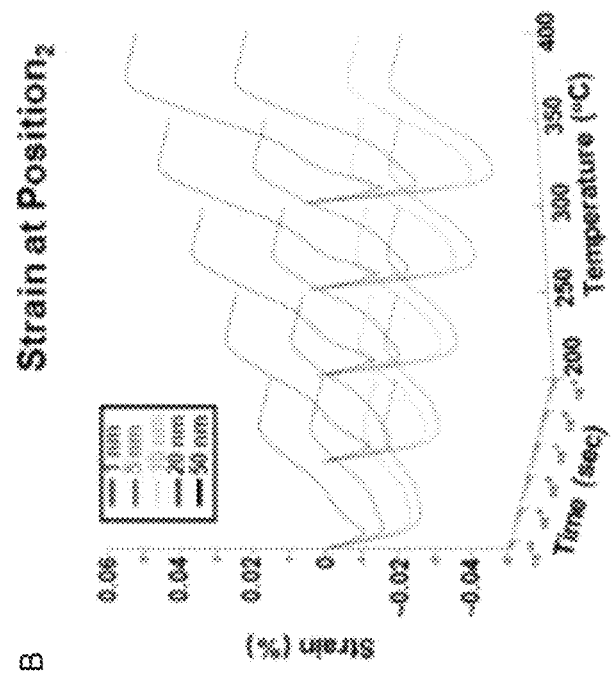
FIG. 8 shows panels A and B, which are finite element simulations of the example strain distribution from FIG. 6 at the point 1 and at the point 2, respectively, as a function of time and temperature.
Figure 8:
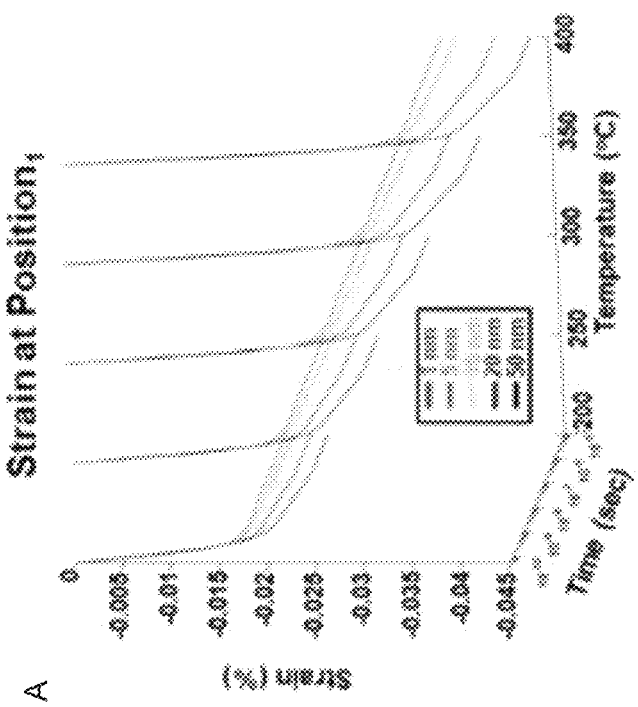

As shown in FIG. 8, panels A and B are finite element simulations of the example strain distribution from FIG. 6 at point 1 and at point 2, respectively, as a function of time and temperature. Panels A and B illustrate that a thinner chromium layer substantially reduces the fluctuation of the strain during etching. Therefore, the mechanical failure with a thicker chromium layer previously seen in FIGS. 5-6 is explained.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings and tables in a particular order, this should not be understood as requiring that such operations be performed in the particular order shown or in sequential order, or that all illustrated operations be performed, to achieve desirable results. Thus, particular implementations of the invention have been described. Other implementations are within the scope of the following claims. In some cases, the actions recited in the claims can be performed in a different order and still achieve desirable results.

What is claimed is:

1. A method, comprising:
providing a substrate including a carbonaceous material, the substrate having a first thermal conductivity;
depositing a first masking layer having a second thermal conductivity on at least a portion of the substrate, a ratio of the second thermal conductivity to the first thermal conductivity being less than or equal to 1:30;
depositing a second masking layer in direct contact with the first masking layer to form an etch mask; and
etching an exposed portion of the substrate using the etch mask that includes both the first masking layer and the second masking layer.

2. The method of claim 1, wherein the first masking layer and the second masking layer are patterned after being deposited on the substrate so as to form the etch mask.

3. The method of claim 1, wherein the carbonaceous material comprises a sp-3 containing carbonaceous material, the sp-3 containing carbonaceous material comprising at least one of a monocrystalline diamond, a randomly oriented diamond, a polycrystalline diamond, a microcrystalline diamond, nanocrystalline diamond, an ultrananocrystalline diamond, or a diamond epilayer/film on a heteroepitaxial substrate.

4. The method of claim 1, wherein the first masking layer has a thermal expansion coefficient below 10 micrometers/(meters·Kelvin) at 25 degrees Celsius.

5. The method of claim 4, wherein the first masking layer comprises chromium.

6. The method of claim 1, wherein an etch selectivity ratio of the substrate to the second masking layer is greater than 1:100.

7. The method of claim 6, wherein the second masking layer comprises nickel.

8. The method of claim 1, wherein the first masking layer has a first thickness of less than 20 nanometers.

9. The method of claim 8, wherein the second masking layer has a second thickness, the second thickness being greater than the first thickness.

10. The method of claim 8, wherein the first thickness is less than 10 nanometers.

11. An etched substrate formed by the process comprising the steps of:
providing a substrate including a carbonaceous material, the substrate having a first thermal conductivity;
depositing a first masking layer having a second thermal conductivity on at least a portion of the substrate, a ratio of the second thermal conductivity to the first thermal conductivity being less than or equal to 1:30;
depositing a second masking layer in direct contact with the first masking layer to form an etch mask; and
etching an exposed portion of the substrates;
wherein the first masking layer has a first thickness and the second masking layer has a second thickness, and a ratio of the first thickness to the second thickness has a minimum value of about 1/30.

12. The etched substrate of claim 11, wherein the first masking layer and the second masking layer are patterned after being deposited on the substrate so as to form the etch mask.

13. The etched substrate of claim 11 wherein the carbonaceous material comprises a sp-3 containing carbonaceous material, the sp-3 containing carbonaceous material comprising at least one of a monocrystalline diamond, a randomly oriented diamond, a polycrystalline diamond, a microcrystalline diamond, a nanocrystalline diamond, an ultrananocrystalline diamond, or a diamond epilayer/film on a heteroepitaxial substrate.

14. The etched substrate of claim 11 wherein the first masking layer has a thermal expansion coefficient below 10 micrometers/(meters·Kelvin) at 25 degrees Celsius.

15. The etched substrate of claim 14, wherein the first masking layer comprises chromium.

16. The etched substrate of claim 11, wherein an etch selectivity ratio of the substrate to the second masking layer is greater than 1:100.

17. The etched substrate of claim 16, wherein the second masking layer comprises nickel.

18. The etched substrate of claim 11, wherein the first masking layer has a first thickness of less than 20 nanometers.

19. The etched substrate of claim 18, wherein the second masking layer has a second thickness, the second thickness being greater than the first thickness.

20. The etched substrate of claim 18, wherein the first masking layer has a first thickness of less than 10 nanometers.

* * * * *